(12) United States Patent
Kawakami et al.

(10) Patent No.: US 7,880,502 B2
(45) Date of Patent: Feb. 1, 2011

(54) LOGIC CIRCUIT

(75) Inventors: Haruo Kawakami, Miura (JP); Yasushi Ogimoto, Tokyo (JP)

(73) Assignee: Fuji Electric Holdings Co., Ltd. (JP)

( * ) Notice: Subject to any disclaimer, the term of this patent is extended or adjusted under 35 U.S.C. 154(b) by 0 days.

(21) Appl. No.: 12/677,069

(22) PCT Filed: Aug. 25, 2008

(86) PCT No.: PCT/JP2008/065084

§ 371 (c)(1),
(2), (4) Date: May 13, 2010

(87) PCT Pub. No.: WO2009/122598

PCT Pub. Date: Oct. 8, 2009

(65) Prior Publication Data

US 2010/0289525 A1   Nov. 18, 2010

(30) Foreign Application Priority Data

Apr. 4, 2008   (JP) .............................. 2008-098372

(51) Int. Cl.
*H03K 19/082* (2006.01)
(52) U.S. Cl. ..................... 326/80; 326/63; 327/199; 365/158
(58) Field of Classification Search ............ 326/63, 326/80–84, 94, 37, 30; 327/205, 199; 365/158, 365/171
See application file for complete search history.

(56) References Cited

U.S. PATENT DOCUMENTS 3,745,308 A * 7/1973 Lefferts ...................... 219/499
3,936,755 A * 2/1976 Sheng ......................... 307/652
4,301,379 A * 11/1981 Reinert ....................... 327/205
4,399,377 A * 8/1983 Jones ........................... 326/37

(Continued)

FOREIGN PATENT DOCUMENTS

JP   2005-235307 A   9/2005

(Continued)

OTHER PUBLICATIONS

International Search Report issued in corresponding PCT/JP2008/065084 mailed Sep. 16, 2008.

*Primary Examiner*—Rexford N Barnie
*Assistant Examiner*—Crystal L Hammond
(74) *Attorney, Agent, or Firm*—Rossi, Kimms & McDowell LLP (57) ABSTRACT

A logic circuit with a simple configuration and good current efficiency is provided. The logic circuit includes a two-terminal bistable switching element (1) having characteristics which maintain states, a first switching element (25) one end of which is connected to one terminal of the two-terminal bistable switching element (1), a second switching element (29) one end of which is connected to the other terminal of the two-terminal bistable switching element (1) via a resistance element (27), and first and second pulse input terminals (33, 37) respectively connected to the one terminal and the other terminal of the two-terminal bistable switching element (1). A bias voltage is applied across the other end of the first switching element (25) and the other end of the second switching element (27), and a trigger pulse is input from the first and second pulse input terminals (33, 37).

12 Claims, 5 Drawing Sheets

U.S. PATENT DOCUMENTS

2005/0174837 A1 8/2005 Hanyu et al.
2005/0282379 A1 12/2005 Saito et al.

FOREIGN PATENT DOCUMENTS

| | | |
|---|---|---|
| JP | 2006-032915 A | 2/2006 |
| JP | 2007-103663 A | 4/2007 |
| WO | 2006/022017 A1 | 3/2006 |
| WO | 2006/115062 A1 | 11/2006 |

* cited by examiner

FIG.9

LOGIC CIRCUIT

This application is a U.S. National Phase Application of PCT International Application PCT/JP2008/65084 filed on Aug. 25, 2008 which is based on and claims priority from JP 2008-098372 filed on Apr. 4, 2008, the contents of which is incorporated herein in its entirety by reference.

TECHNICAL FIELD

This invention relates to a logic circuit employing a two-terminal switching element having memory properties, and in particular a spin-valve element utilizing the tunnel magnetic resistance (TMR) effect or the giant magnetic resistance (GMR) effect.

BACKGROUND ART

This invention relates to a logic circuit employing a two-terminal switching element having memory properties, and in particular a spin-valve element utilizing the tunneling magnetoresistance (TMR) effect or the giant magnetoresistance (GMR) effect.

Recent advances in nanoelectronics have been accompanied by the development of products which apply physical phenomena unique to minute-size magnetic materials, and there have been especially rapid advances in the field of spin electronics, in which the spin of free electrons in magnetic materials is utilized.

In this field of spin electronics, spin-valve elements which apply the tunneling magnetoresistance (TMR) effect occurring in a multilayer structure of a ferromagnetic layer, an insulating layer, and a ferromagnetic layer, or which apply the giant magnetoresistance (GMR) effect occurring in a multilayer structure of a ferromagnetic layer, a nonmagnetic layer (conducting layer), and a ferromagnetic layer, are currently regarded as having the highest possibility of practical application.

Such spin-valve elements are attracting the most attention for applications in magnetic random access memory (MRAM). This is because expectations are being placed on magnetic random access memory employing such spin-valve elements as a replacement for conventional DRAM (Dynamic Random Access Memory) and SDRAM (Synchronous DRAM).

These spin-valve elements are fundamentally bistable resistance elements, having two stable resistance values for a single applied voltage value. Hence if a logic circuit having memory properties is formed using such spin-valve elements, there is the possibility that the number of elements can be greatly reduced compared with logic circuits employing conventional silicon elements. Hence in light of efforts to raise integration levels and for other reasons, hopes are being placed on the realization of logic circuits employing these spin-valve elements.

However, at present there have been hardly any proposals of specific logic circuits which exploit the features of spin-valve elements. That is, in for example Patent Reference 1, formation of a programmable logic circuit using spin transistors is disclosed, but this circuit is based on conventional CMOS circuits, and does not necessarily take advantage of the high degree of integrability which is a feature of spin-valve elements.

Further, Patent Reference 2 proposes an element comprising a third electrode to detect its own potential in a magnetic layer of a spin-valve element, as well as a logic circuit using such an element; but a specific circuit configuration is not disclosed. Moreover, because the spin-valve element used as three terminals, the logic circuit does not have a structure suitable for high levels of integration.

Among logic circuits, there have in particular been no specific proposals regarding configurations in which flip-flop circuits (bistable circuits) which are necessary for sequential logic circuits are configured using spin-valve elements. Here, in sequential logic circuits, the output value is determined from the time series of input logic values up to that point in time.

Figure 9:
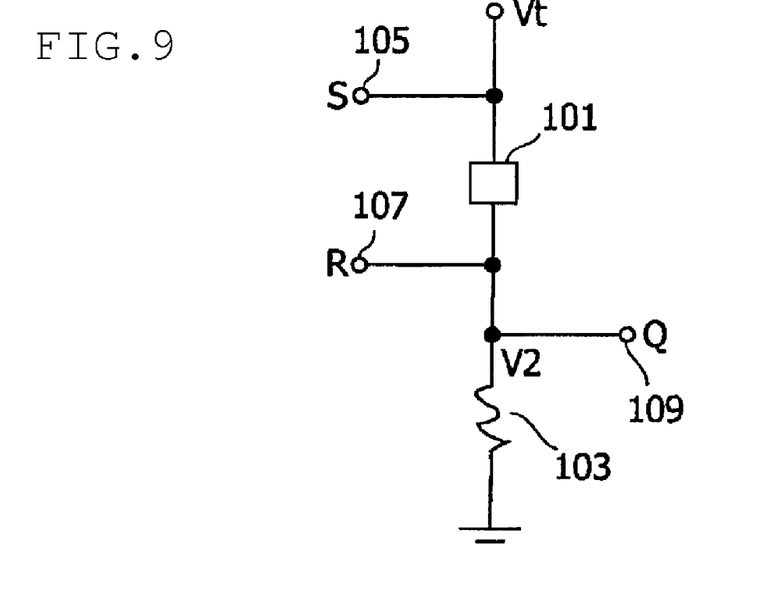
FIG. 9 is an explanatory diagram showing a configuration example of a logic circuit of the prior art.

Patent Reference 3 proposes a logic circuit (bistable circuit) configured using an organic bistable resistance element, having two stable resistance values for a single applied voltage value. An example of the logic circuit is shown in FIG. 9.

This logic circuit has a configuration in which a resistor element 103 is connected in series with a two-terminal switching element 101 which is an organic bistable resistance element, and operates as follows. That is, when the two-terminal switching element 101 is in a low-resistance state, by inputting a trigger pulse with prescribed voltage to the reset input terminal 107 in a state in which a DC bias voltage Vt is applied, the two-terminal switching element 101 transitions to a high-resistance state, and as a result the potential at the output terminal 109 changes from Vt-Von to Vt-Voff. Here Von is the terminal voltage of the element 101 in the low-resistance state, and Voff (>Von) is the terminal voltage of the element 101 in the high-resistance state.

On the other hand, when the two-terminal switching element 101 is in the high-resistance state, by inputting a trigger pulse with a prescribed voltage to the set input terminal 105 in a state in which a DC bias voltage Vt is applied, the two-terminal switching element 101 transitions to the low-resistance state, and as a result the potential at the output terminal 109 changes from Vt-Voff to Vt-Von. When trigger pulses are input simultaneously to the input terminals 105 and 107, the pulses cancel, and so there is no change in the state of the output terminal 109.

Hence this logic circuit functions as a so-called RS flip-flop.

Patent Reference 1: Japanese Patent Application Laid-open No. 2006-32915
Patent Reference 2: Japanese Patent Application Laid-open No. 2007-103663
Patent Reference 1: International Publication WO2006/22017

However, in the above logic circuit, the two-terminal switching element 101 comprising an organic bistable resistance element does not have memory properties, so that a bias voltage Vt must be applied continuously to maintain the state. Hence there are the drawbacks that current leaks to the bias voltage line when applying a write input pulse, and that there is wasteful power consumption.

DISCLOSURE OF THE INVENTION

In light of the above problems, this invention has as an object the provision of a logic circuit using a two-terminal bistable switching element having memory properties, with a simple configuration and good current efficiency.

This invention provides a logic circuit, comprising a two-terminal bistable switching element, that has characteristics such that a state having a first resistance value is entered when a voltage equal to or less than a first threshold voltage is applied, and a state having a second resistance value different from the first resistance value is entered when a voltage equal to or greater than a second threshold voltage which is greater than the first threshold voltage, is applied, and that has characteristics which maintain each of the states when no voltage is applied; a first switching element, one end of which is connected to one of the terminals of the two-terminal bistable switching element; a second switching element, one end of which is connected, via a resistor element, to the other terminal of the two-terminal bistable switching element; and first and second pulse input terminals, respectively connected to the one terminal and the other terminal of the two-terminal bistable switching element; and characterized in that a bias voltage is applied across the other end of the first switching element and the other end of the second switching element, and a trigger pulse is input from the first and second pulse input terminals.

This logic circuit can further comprise third and fourth switching elements, respectively connected to the one terminal and the other terminal of the two-terminal bistable switching element. In this case, when a trigger pulse is input from the second pulse input terminal, the third switching element operates so as to lower the impedance at the one terminal of the two-terminal bistable switching element, and when a trigger pulse is input from the first pulse input terminal, the fourth switching element operates so as to lower the impedance at the other terminal of the two-terminal bistable switching element.

As the two-terminal bistable switching element, for example a spin-valve element having at least an insulating layer or a nonmagnetic layer, and a pair of ferromagnetic layers having different coercivities and provided so as to sandwich the insulating layer or nonmagnetic layer, or a bistable resistance element having an insulating thin film and a pair of electrodes provided so as to sandwich the insulating thin film, can be employed.

Further, the two-terminal bistable switching element may be an atomic switch that is configured to control, by applying an electric field to a minute gap between a solid electrolytic electrode and a metal electrode, the formation and annihilation of metal clusters in the gap, and to perform electrical on/off switching across the solid electrolyte electrode and the metal electrode by means of this control.

This invention provides a logic circuit, comprising first and second two-terminal bistable switching elements that have characteristics such that a state having a first resistance value is entered when a voltage equal to or less than a first threshold voltage is applied, and a state having a second resistance value different from the first resistance value is entered when a voltage equal to or greater than a second threshold voltage which is greater than the first threshold voltage is applied, that have characteristics which maintain each of the states when no voltage is applied, and that are connected in series with polarities matching; first and second switching elements, one end of which is connected to one end and to the other end respectively of the series circuit of the first and second two-terminal bistable switching elements; a first pulse input terminal, connected to one end and to the other end of the series circuit; and a second pulse input terminal, connected to the center point of the series circuit; and characterized in that a bias voltage is applied across the other end of the first switching element and the other end of the second switching element, and a trigger pulse is input from the first and second pulse input terminals.

This logic circuit can further comprise third, fourth, and fifth switching elements, respectively connected to the one end, the other end, and the center point of the series circuit. In this case, when a trigger pulse is input from the second pulse input terminal, the third and fourth switching elements operate so as to lower the impedance at the one end and at the other end of the series circuit, and when a trigger pulse is input from the first pulse input terminal, the fifth switching element operates so as to lower the impedance at the center point of the series circuit.

As at least one of the first and second two-terminal bistable switching elements, for example a spin-valve element having at least an insulating layer or a nonmagnetic layer, and a pair of ferromagnetic layers having different coercivities and provided so as to sandwich the insulating layer or nonmagnetic layer, or a bistable resistance element having an insulating thin film and a pair of electrodes provided so as to sandwich the insulating thin film, can be employed.

Further, at least one of the first and second two-terminal bistable switching elements may be an atomic switch that is configured to control, by applying an electric field to a minute gap between a solid electrolytic electrode and a metal electrode, the formation and annihilation of metal clusters in the gap, and to perform electrical on/off switching across the solid electrolyte electrode and the metal electrode by means of this control.

The first and second pulse input terminals are each connected where necessary via rectifying elements.

By means of this invention, a two-terminal bistable switching element (spin-valve element, atomic switch, or similar) having memory properties (non-volatile properties) is used, so that when applying a write input pulse, there is no drawback of current leakage to a bias voltage line or wasteful power consumption, and consequently a flip-flop circuit can be configured with a simple configuration and good current efficiency.

EXPLANATION OF REFERENCE NUMERALS 1, 1', 2 Spin-valve element
3 Substrate
4 Insulating layer
7 Ferromagnetic layer (fixed layer)
9 Ferromagnetic layer (free layer)
11, 13 Electrode layer
15 Antiferromagnetic layer (pinning layer)
17 Capping layer
23 Nonmagnetic layer
25, 29 Switching element
27 Resistor element
31, 35, 47 Rectifying element
33 Set input terminal
37 Reset input terminal 39 Output terminal
41, 43, 51, 53, 55 Switching element
57 Amplification transistor

BEST MODE FOR CARRYING OUT THE INVENTION

Figure 2:
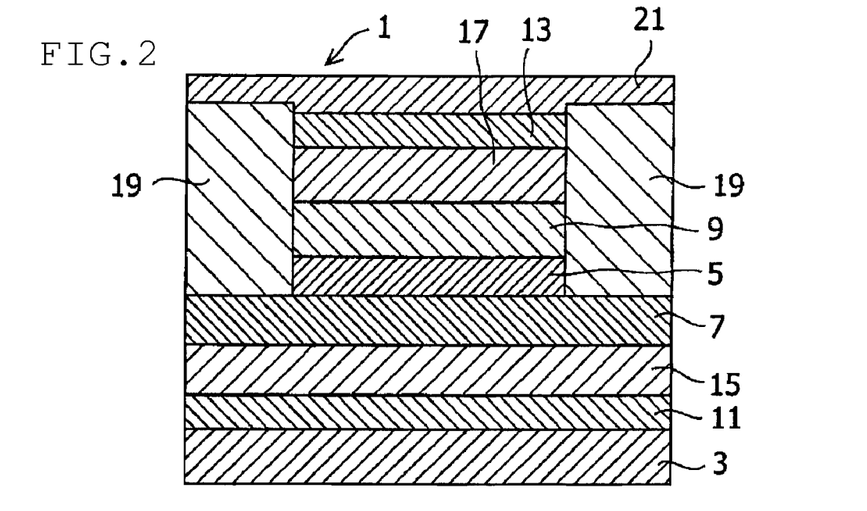
FIG. 2 is a cross-sectional view showing the basic constituent portion of a spin-valve element utilizing TMR.

Below, embodiments of the invention are explained. In the first through fourth embodiments of the invention explained below, spin-valve elements are used as bistable elements. First, these spin-valve elements are explained. FIG. 2 shows the basic configuration of a spin-valve element 1 employing the tunneling magnetoresistance (TMR) effect. This spin-valve element 1 comprises a single layer of an insulating layer 5 formed on a substrate 3 and a pair of ferromagnetic layers 7 (fixed layer) and 9 (free layer) sandwiching the insulating layer 5; when necessary, electrode layers 11 and 13, an antiferromagnetic layer (pinning layer) 15, a capping layer 17, and similar are added.

The direction of magnetization of the ferromagnetic layer 7 is fixed by magnetic coupling with the antiferromagnetic layer 15 and similar. When electrons are caused to flow from the fixed layer 7 into this spin-valve element 1, a torque acts so as to make the spin of the free layer 9 parallel with that of the fixed layer 7. Conversely, when electrons are caused to flow from the free layer 9 toward the fixed layer 7, a torque acts so as to make the spin of the free layer 9 antiparallel with that of the fixed layer 7. By means of this action, the magnetization direction of the free layer 9 can be controlled through the direction of the current (spin-transfer magnetization reversal).

In order to suppress the exchange interaction due to leakage magnetic fields from the film end portions of the ferromagnetic layers 7 (fixed layer) and 5 (free layer), generally the upper-side portion from the insulating layer 5 is made sufficiently shorter than the substrate side, and an insulating film 10 is formed on the periphery. There are a number of methods for forming these structures; one example is a method comprising a process of forming the multilayer film from 2 to the electrode 7, an exposure process using a negative resist application and a photolithography technique, a process of cutting to expose the upper portion of the insulating layer 5 by ion milling, a process of forming an insulating layer 10 by $SiO_2$ deposition or similar, and a process of forming wiring 11 after lift-off.

Figure 3:
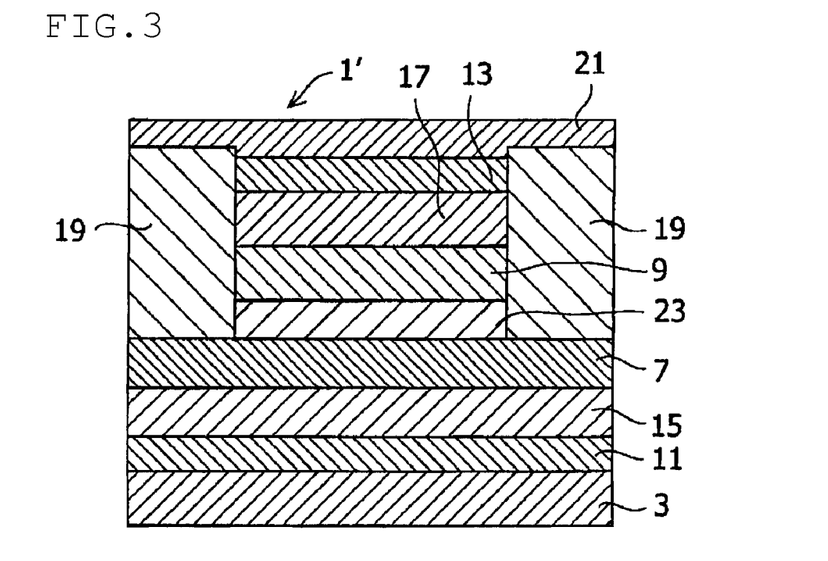
FIG. 3 is a cross-sectional view showing the basic constituent portion of a spin-valve element utilizing GMR.

FIG. 3 shows a basic constituent portion of a spin-valve element 1' employing the giant magnetoresistance (GMR) effect. The spin-valve element is basically the same, with respect to configuration and functions, as the spin-valve element 1 employing the TMR effect, except for the fact that the insulating layer 5 is replaced with a nonmagnetic (conducting) layer 23 in FIG. 3.

Figure 4:
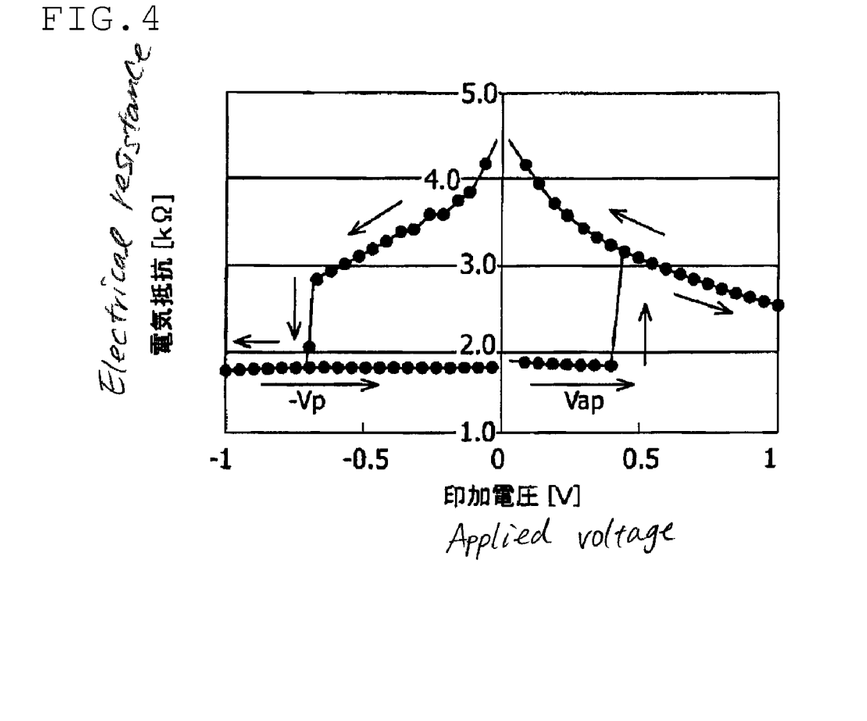
FIG. 4 is an explanatory diagram showing an example of the electrical characteristics of a spin-valve element.

The spin-valve elements 1, 1' generally have electrical characteristics such as shown in FIG. 4 (here, the voltage and current direction is taken to be positive when the direction is from the fixed layer 7 toward the free layer 9).

That is, when electrons are caused to flow from the fixed layer 7 (the negative direction for voltage and current), a torque acts on the spin of the free layer 9 so as to cause it to be parallel with that of the fixed layer 7. As a result, at or below a certain threshold voltage $-V_p$, the spins of the free layer 9 and fixed layer 7 become parallel, and the electrical resistance is reduced (equivalent to a negative voltage in FIG. 4). Conversely, when electrons are caused to flow from the free layer 9 toward the fixed layer 7, a torque acts on the spin of the free layer 9 to cause it to be antiparallel with that of the fixed layer 7. As a result, at or above a different threshold voltage Vap, the electrical resistance increases.

Figure 1:
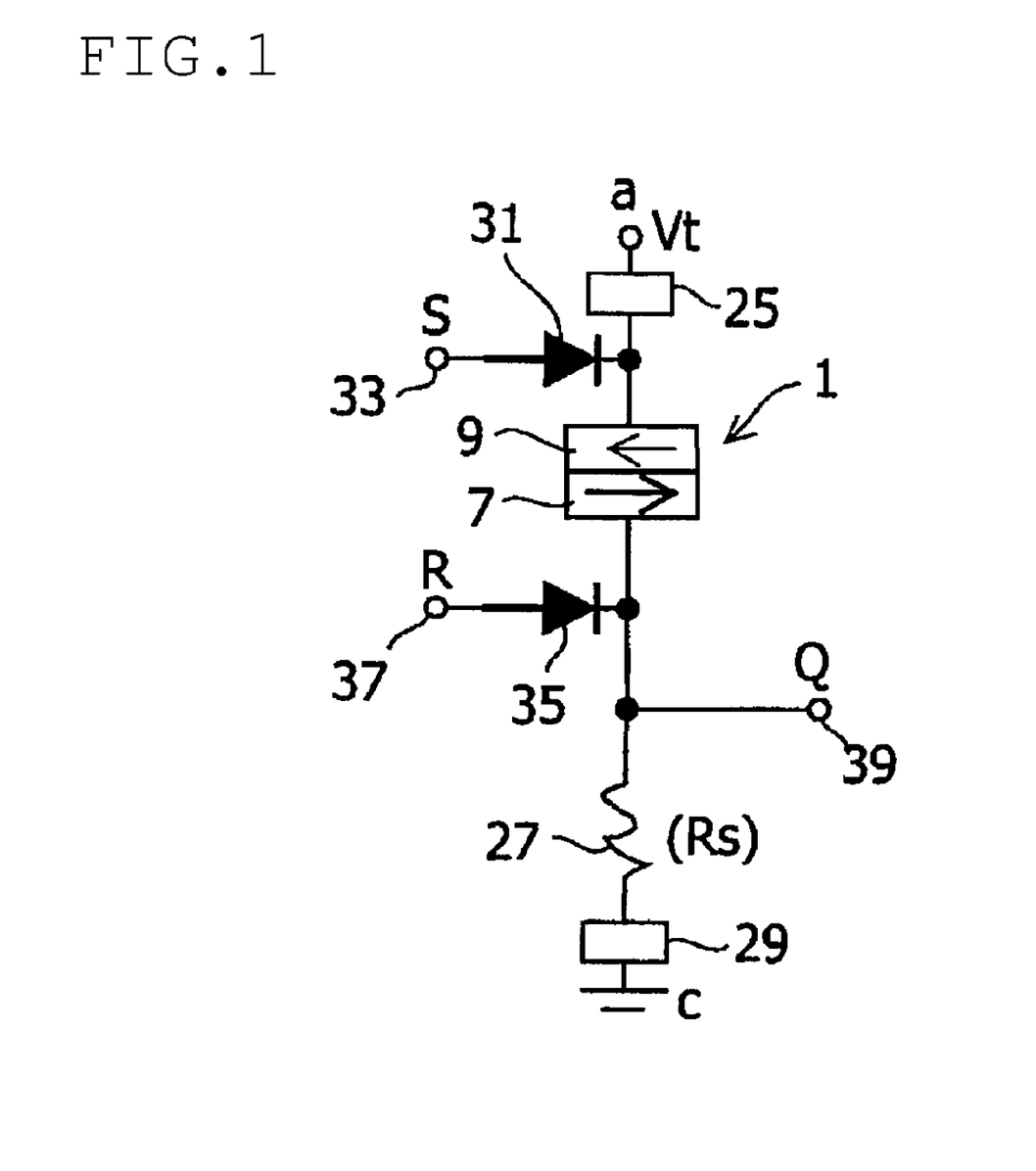
FIG. 1 is a circuit diagram showing a first embodiment of a logic circuit of the invention.

FIG. 1 shows the basic configuration of the logic circuit of a first embodiment of the invention. In this embodiment, the spin-valve element 1 is used as a two-terminal bistable switching element having memory functions; of course, the spin-valve element 1', an atomic switch, or another two-terminal bistable switching element having similar functions may be used. Similar remarks apply to the other embodiments described below.

The logic circuit of this embodiment has a configuration in which a switching element 25, the spin-valve element 1, a resistor element 27, and a switching element 29 are connected in series between the terminal a and the ground terminal c. One of the terminals of the spin-valve element 1 connected to the switching element 25 is connected via a rectifying element 31 to the set input terminal (S terminal) 33, and the other terminal of the spin-valve element 1 connected to the resistor element 27 is connected via a rectifying element 35 to the reset input terminal (R terminal) 37, and is also connected to the output terminal (Q terminal) 39.

This logic circuit operates as follows. That is, with the switching elements 25 and 29 in the off state, when a DC bias voltage Vt is applied across the terminals a and c, a voltage with a value corresponding to the current state of the spin-valve element 1 is output from the Q terminal 39.

Here, the DC bias voltage Vt is selected such that the state of the spin-valve element 1 does not change, and specifically, such that the voltage applied to the spin-valve element 1 is sufficiently smaller than the voltages Vp and Vap shown in FIG. 2.

If the resistance value of the spin-valve element 1 in the low-resistance state is Ron, and the resistance value in the high-resistance state is Roff, then the voltage values Von and Voff at the Q terminal 39 in the low-resistance state and in the high-resistance state are respectively expressed as follows.

$$Von = Vt \times Rs/(Rs+Ron)$$

$$Voff = Vt \times Rs/(Rs+Roff)$$

Here Rs is the resistance value of the resistor element 27.

Switching between two operating points can be controlled by passing a switching current through the spin-valve element 1 in the state in which the switching elements 25 and 29 are both turned on. That is, by inputting a pulse current from the S terminal 33, the voltage at the Q terminal 39 can be made Von, and by inputting a pulse current from the R terminal 37, the voltage at the Q terminal 39 can be made Voff. Specifically, with the absolute value of the larger between the voltage Vp and Vap shown in FIG. 2 being defined as Vm, a voltage pulse equal to or greater than Vm is selectively applied to the S terminal 33 and R terminal 37 as a trigger signal. That is, if the voltage pulse is input to the S terminal 33, electrons flow in the spin-valve element 1 from the fixed layer 7 toward the free layer 9, so that the spin-valve element 1 transitions to the low-resistance state. As a result, the potential at the Q terminal 39 becomes $Von = Vt \times Rs/(Rs+Ron)$, regardless of the state prior to the flow of current. Similarly, if the voltage pulse is applied to the R terminal 37, electrons flow in the spin-valve element 1 from the free layer 9 toward the fixed layer 7, so that the spin-valve element 1 transitions to the high-resistance state. As a result, the potential at the Q terminal 39 becomes $Voff = Vt \times Rs/(Rs+Roff)$, regardless of the state prior to the flow of current.

Synchronization of the input timing of the voltage pulses to the S terminal 33 and R terminal 37 with the on/off timing of the switching elements 25 and 29 can for example easily be achieved by a method in which field effect transistors are used as the switching elements 25 and 29, and the timing of input of the voltage pulses to the S terminal 33 and R terminal 37 is synchronized with the timing of input of gate signals to each of the transistors corresponding to these terminals 33 and 37.

Figure 5:
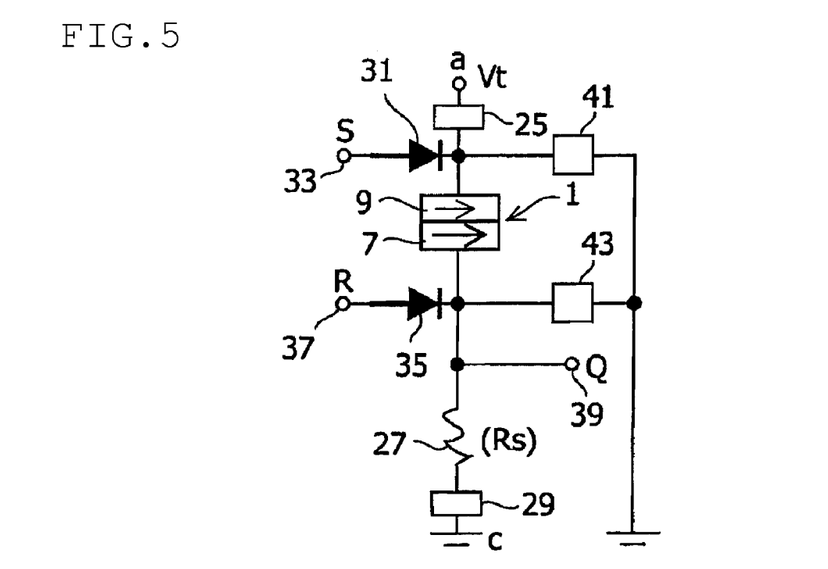
FIG. 5 is a circuit diagram showing a second embodiment of a logic circuit of the invention.

FIG. 5 shows the logic circuit of a second embodiment of the invention. The logic circuit of this embodiment differs from the first embodiment above in further comprising switching elements 41 and 43. One end of the switching element 41 is connected to one terminal of the spin-valve element 1, and the other end is grounded. One end of the switching element 43 is connected to the other terminal of the spin-valve element 1, and the other end is grounded.

In this logic circuit, when a voltage pulse equal to or greater than the above Vm is applied to the S terminal 33 and at the same time the switching elements 41 and 43 are respectively operated to turn off (non-conducting) and turn on (conducting), electrons flow in the spin-valve element 1 from the fixed layer 7 toward the free layer 9, so that the spin-valve element 1 transitions to the low-resistance state. As a result, the potential at the Q terminal becomes Von=Vt×Rs/(Rs+ron), regardless of the state prior to the flow of current.

On the other hand, when a voltage pulse equal to or greater than Vm is applied to the R terminal 37, and at the same time the switching elements 41 and 43 are respectively operated to turn on and turn off, electrons flow in the spin-valve element 1 from the free layer 9 toward the fixed layer 7, so that the spin-valve element 1 transitions to the high-resistance state. As a result, the potential at the Q terminal becomes Voff=Vt×Rs/(Rs+roff), regardless of the state prior to the flow of current.

Synchronization of the input timing of the voltage pulses to the S terminal 33 and R terminal 37 with the on/off timing of the switching elements 41 and 43 can for example easily be achieved by a method in which field effect transistors are used as the switching elements 41 and 43, and the timing of input of the voltage pulses to the S terminal 33 and R terminal 37 is synchronized with the timing of input of gate signals to each of the transistors corresponding to these terminals 33 and 37.

By means of the logic circuit of this second embodiment, the connection portion of the rectifying element 35 is grounded via the switching element 43 simultaneously with input of a voltage pulse to the S terminal 33, and moreover the connection portion of the rectifying element 31 is grounded via the switching element 41 simultaneously with input of a voltage pulse to the R terminal 37, so that leaking of the input pulse from the S terminal 33 to the side of the R terminal 37, and leaking of the input pulse from the R terminal 37 to the side of the S terminal 33, is prevented. Hence there is the advantage that it is no longer necessary to consider conditions related to the impedance from one end of the spin-valve element 1 as seen from the S terminal 33 or the impedance from the other end of the spin-valve element 1 as seen from the R terminal 37.

No change in state occurs in the logic circuits of the above first and second embodiments when a voltage pulse is not input to either the S terminal 33 or to the R terminal 37. When voltage pulses are input simultaneously to both the S terminal 33 and the R terminal 37, the pulses cancel, so that again there is no change in state.

The spin-valve element 1 has memory properties, so that even when the switching elements 25 and 29 are in the off state, that is, even in a state in which a bias voltage is not applied, the state of the Q output terminal 39 is maintained, and even in a state in which the pulse currents from the S terminal 33 and R terminal 37 vanish, the state of the Q output terminal 39 is maintained.

Hence in the logic circuits of the above first and second embodiments, if the input of pulses to the S terminal 33 and R terminal 37 corresponds to 1, no input corresponds to 0, the current state value of the Q terminal 39 is Qn, and the state value of the Q terminal 39 in the next stage when a pulse is input is Qn+1, then the state value of the Q terminal 39 (the voltage value) changes as in the table below according to the combination of input "1" and non-input "0" to the S terminal 33 and R terminal 37.

In each of the above embodiments, pulses having the same voltage value and time width are input to the S terminal 33 and R terminal 37; but if the above-described conditions are satisfied, pulses with different voltage values and time widths can be used as input pulses.

TABLE 1

| S | R | $Q_{n+1}$ | Notes |
|---|---|---|---|
| 0 | 0 | $Q_n$ | unchanged |
| 1 | 0 | Von | set |
| 0 | 1 | Voff | reset |
| 1 | 1 | $Q_n$ | unchanged |

Flip-flop circuits are classified, according to functions, into RS (reset/set) flip-flop circuits, JK flip-flop circuits, T (trigger) flip-flop circuits, and D (delay) flip-flop circuits (see for example Takeo Miyata, *Shokkai Ronri Kairo* (Handbook of Logic Circuits), p. 89, 1998, Corona publ.).

Below, the truth table for the above-described RS flip-flop circuit, which is the most basic flip-flop circuit, is described.

TABLE 2

| S | R | $Q_{n+1}$ | Notes |
|---|---|---|---|
| 0 | 0 | $Q_n$ | unchanged |
| 1 | 0 | 1 | set |
| 0 | 1 | 0 | reset |
| 1 | 1 | — | forbidden |

In general, the relation Von>Voff exists between Von(=Vt×Rs/(Rs+Ron)) and Voff(=Vt×Rs/(Rs+Roff)) shown in Table 1. Hence if Von and Voff are respectively defined as the set state "1" and the reset state "0", then it is seen that the logic circuits of the above first and second embodiments operate according to Table 2, that is, as Rs flip-flop circuits. At this time, the input of R=S=1 is forbidden.

Other types of flip-flop circuits can be configured, based on an Rs flip-flop circuit, combining other types of elements (see the above reference *Sokkai Ronri Kairo* (Handbook of Logic Circuits)).

Figure 6:
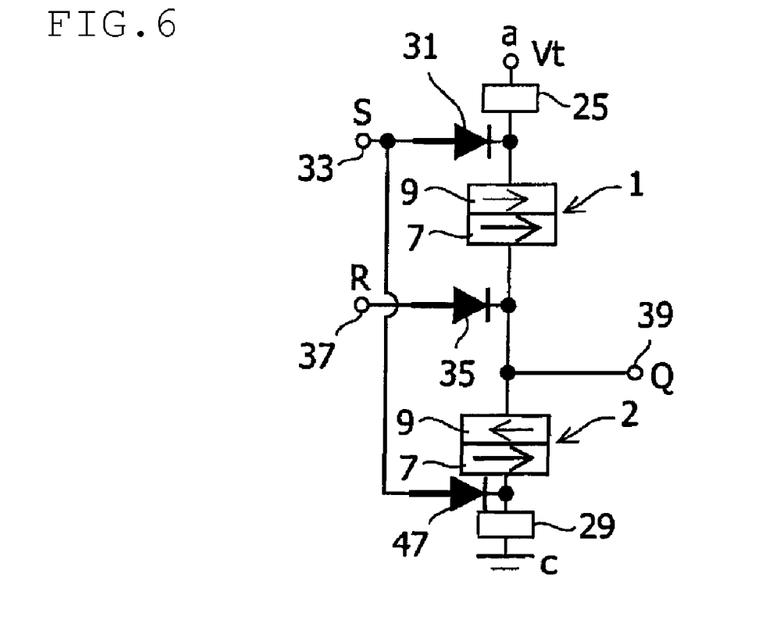
FIG. 6 is a circuit diagram showing a third embodiment of a logic circuit of the invention.

FIG. 6 shows the logic circuit of a third embodiment of the invention. The logic circuit of this embodiment has a configuration in which the resistor element 27 of the logic circuit shown in FIG. 1 is replaced with a spin-valve element 2, and the one end and the other end of the series circuit of the two-terminal bistable switching elements 1, 2 are connected to the S terminal 39 via the rectifying elements 31 and 47 respectively, while the center point of the series circuit is connected to the R terminal 37 via the rectifying element 35.

The spin-valve element 2 has a configuration and characteristics (see FIG. 2) equivalent to those of the spin-valve element 1, and is connected in series with the spin-valve element 1 in a manner such that the polarity direction is the same as for the spin-valve element 1.

In the logic circuit of this embodiment, when a voltage pulse equal to or greater than Vm is applied to the S terminal 33 with the switching elements 25 and 29 in the on state, electrons flow from the fixed layer 7 toward the free layer 9 in the spin-valve element 1, and electrons flow from the free layer 9 toward the fixed layer 7 in the spin-valve element 2. As a result, the spin-valve element 1 transitions to the low-resistance state, and the spin-valve element 2 transitions to the high-resistance state.

The voltage at the Q terminal 39 in this state is Von=Vt× Roff/(Ron+Roff). Here, Ron and Roff are the resistance values of the low-resistance state and the high-resistance state respectively of the spin-valve elements 1 and 2.

Next, when a voltage pulse equal to or greater than Vm is applied to the R terminal 37, the directions of the flow of electrons in the spin-valve elements 1 and 2 are the opposite of those above, so that the states of the spin-valve elements 1 and 2 are inverted, and as a result the voltage at the Q terminal 39 becomes Voff=Vt×Ron/(Ron+Roff).

As explained above, in general the relation Von>Voff exists between Von and Voff. Hence if Von and Voff are defined as the set state "1" and the reset state "0", then it is seen that the logic circuit of this embodiment operates according to Table 2 above (operates as an Rs flip-flop).

In the logic circuit of this third embodiment, one of the spin-valve elements 1 and 2 is in the high-resistance state in both the set and the reset states, so that there is the advantage that the current value when a bias voltage Vt is applied is reduced.

Figure 7:
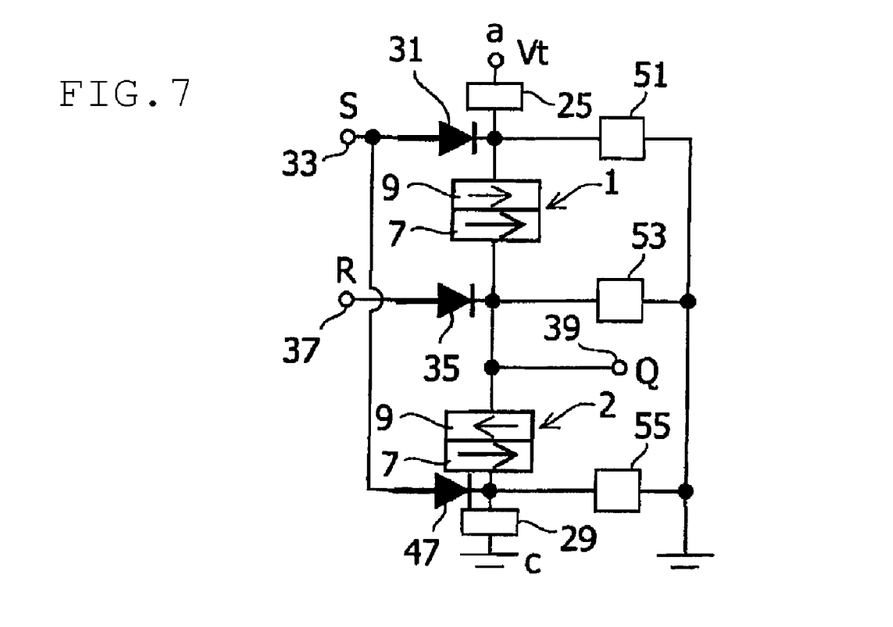
FIG. 7 is a circuit diagram showing a fourth embodiment of a logic circuit of the invention.

FIG. 7 shows the logic circuit of a fourth embodiment of the invention. The logic circuit of this embodiment has a configuration which adds switching elements 51, 53 and 55 to the logic circuit of the third embodiment. One end of the switching elements 51 and 55 is connected to the one end and to the other end respectively of the series circuit of the two-terminal bistable switching elements 1 and 2, and one end of the switching element 53 is connected to the center point of the series circuit. The other ends of the switching elements 51, 53 and 55 are all grounded.

In this logic circuit, at the same time that a voltage pulse is applied to the S terminal 33, the switching elements 51 and 55 are turned off, and the switching element 53 is turned on. By this means, the spin-valve element 1 transitions to the low-resistance state, and the spin-valve element 2 transitions to the high-resistance state.

Further, at the same time that a voltage pulse is applied to the R terminal 37, the switching elements 51 and 55 and the switching element 53 are turned on and turned off respectively, and by this means the states of the spin-valve elements 1 and 2 are inverted.

Synchronization of the input timing of the voltage pulses to the S terminal 33 and R terminal 37 with the on/off timing of the switching elements 51, 53, 55 can for example easily be achieved by a method in which field effect transistors are used as the switching elements 51, 53, 55, and the timing of input of the voltage pulses to the S terminal 33 and R terminal 37 is synchronized with the timing of input of gate signals to each of these transistors.

By means of the logic circuit of this fourth embodiment, in addition to the advantages of the logic circuit of the third embodiment, the following advantages are obtained. That is, there is no longer leaking of input pulses from the S terminal 33 and R terminal 37 to the R terminal 37 and S terminal 33 respectively, so that it is no longer necessary to consider conditions related to the impedance from the coupling area of the switching element 25 and spin-valve element 1 as seen from the S terminal 33 or the impedance from the coupling area of the spin-valve element 1 and resistor element 27 as seen from the R terminal 37.

The logic circuits of the first through fourth embodiments have memory properties, and so after logic operations are performed through pulse input from the S terminal 33 and R terminal 37, the operation result is stored even when the power supply is turned off, and the operation result can be read out when necessary by again providing power. Hence there is the advantage that power consumption can be reduced.

The rectifying elements 31, 35 shown in FIG. 1 and the rectifying element 47 shown in FIG. 6 can also be omitted if the impedances of the S terminal 33 and R terminal 37 are sufficiently high.

Figure 8:
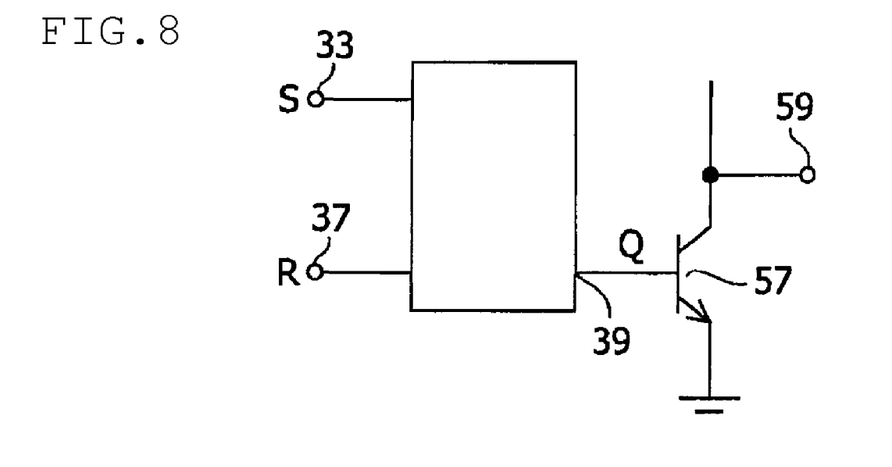
FIG. 8 is a circuit diagram for a case in which an amplifier is connected to a logic circuit of the invention.

Also, in the later stages of the logic circuits of the above embodiments, an amplification circuit can be added where necessary. FIG. 8 shows an example in which an amplification circuit, comprising one bipolar transistor, is used; the base terminal of the bipolar transistor is connected to the Q terminal 39 of the logic circuit.

Features of the spin-valve elements used in the above embodiments include, in addition to memory properties, a long repeat lifetime, and high-speed operation.

As described above, such spin-valve elements are broadly divided into TMR spin-valve elements 1, shown in FIG. 2, and GMR spin-valve elements 1', shown in FIG. 3.

As the substrate 2 of the TMR spin-valve element 1, silicon substrate or glass substrate is used. To give representative examples, as the material of the electrode layers 11 and 13, Ta, Pt, Cu, or Au is used; as the material of the antiferromagnetic layer 15, IrMn or PtMn is used; as the material of the ferromagnetic layer 7 (fixed layer), Co, CoFe, or CoFeB is used; as the material of the insulating layer 5, $Al_2O_3$ or MgO is used; as the material of the ferromagnetic layer 9 (free layer), Co, CoFe, CoFeB, or NiFe is used; and as the material of the capping layer 17, Cu or Pd is used, but the materials used are not limited to these.

When fabricating the spin-valve element 1, after layering the above constituent materials, annealing in a magnetic field is effective to adjust the crystallinity of each of the layers and the magnetic anisotropy of the fixed layer. In addition, when necessary the ferromagnetic layer 7 (fixed layer) and ferromagnetic layer 9 (free layer) can for example be made a CoFeB/Ru/CoFeB or other antiferromagnetically coupled film. As explained above, a GMR spin-valve element 1' has a configuration similar to that of a TMR spin-valve element 1, except for the fact that the insulating layer 5 in the TMR spin-valve element 1 is replaced with a nonmagnetic (conducting) layer 23.

As another two-terminal bistable switching element different from the above spin-valve elements 1, 1', a bistable resistance element comprising a single layer of an insulating thin film and electrodes sandwiching this insulating thin film is known; such an element is also preferred for this invention.

This bistable resistance element can for example employ as the insulating material $Fe_2O_3$, NiO, CoO, $Cu_xO$, $TiO_2$, $Ta_2O_5$, $Nb_2O_5$, $Al_2O_3$, $ZrO_x$, and various perovskite oxides ($Pr_{1-x}Ca_xMnO_3$, $SrTiO_3$, and similar), and as the electrode material can use Pt, Ti, Ni, Cu, and TiN; but materials used are not limited to these.

In this bistable resistance element, the resistance can be reversibly changed by applying a voltage bias across the upper electrode and lower electrode. In addition to the feature of having memory properties, such a bistable resistance element comprising an insulating thin film has the added features of a high ratio of the two resistance values, and the capability of fast operation.

Further, as a two-terminal bistable switching element in this invention, an atomic switch can also be used. In an atomic switch, by applying an electric field to a minute gap between a metal electrode and a solid electrolytic electrode comprising AgS, $Cu_2S$ or similar, the formation and annihilation of metal clusters in the gap are controlled, and by means of this control, electrical on/off control across the solid electrolyte electrode and the metal electrode is performed.

Because almost no current flows in the off state, this atomic switch has the feature of a large ratio of the two resistance values, and of course also has memory properties.

When applying the above-described bistable resistance elements, atomic switches, or other two-terminal bistable switching elements to the embodiments shown in FIG. 6 and FIG. 7, at least one of the elements 1 and 2 can be replaced with these other two-terminal bistable switching elements. And, when replacing both the elements 1 and 2 with these other two-terminal bistable switching elements, one of the elements 1 and 2 may be replaced with the above-described bistable resistance element, and the other may be replaced with the above-described atomic switch.

Practical Examples

Practical Example 1

A TMR spin-valve element 1 was fabricated using the following procedure. That is, a sputtering method was used to deposit, in order on a silicon substrate 3, Au (5 nm thick)/Ta (5 nm thick) as an electrode layer 11; $Ni_{80}Fe_{20}$ (5 nm thick)/ IrMn (8 nm thick) as an antiferromagnetic layer 15; $Co_{70}Fe_{30}$ (2 nm thick)/Ru (0.8 nm thick)/$Co_{40}Fe_{40}B_{20}$ (6 nm thick) as a ferromagnetic layer 7; MgO (0.8 nm thick) as an insulating layer 5; $Co_{40}Fe_{40}B_{20}$ (2 nm thick)/Ta (5 nm thick)/Ru (5 nm thick) as a free layer 9; Cu (2 nm thick) as a capping layer 17; and Au (2 nm thick) as an electrode layer 13. In addition, after applying a negative resist, electron beam irradiation was used in patterning, and ion milling was performed to form an elliptical column-shape spin-valve element measuring 100 nm×50 nm. Next, a CVD method was used to form an $SiO_2$ film, and the resist on the spin-valve element was removed by lifting off, after which annealing was performed at 350° C. in a magnetic field of approximately 4 kOe. Using the spin-valve element obtained in this way, the circuit shown in FIG. 1 was formed as a sample for Practical Example 1. Here, as the switching elements 25 and 27, bipolar transistors having an emitter-collector voltage loss in the ON state of 0.2 V were used, and as the resistor element 27, an element with a resistance value Rs of 2 kΩ was used.

Practical Example 2

As the circuit, that shown in FIG. 7 was used. As the switching elements 51, 53, 55, field effect transistors were used, and by using a method similar to that of Practical Example 1 to fabricate the spin-valve elements 1 and 2, a sample for Practical Example 2 was obtained.

Practical Example 3

A bistable resistance element 1' using an insulating thin film was fabricated by the following procedure. That is, a sputtering method was used to deposit, as a lower electrode layer 11, Cu (200 nm thick) on a silicon substrate 2, after which ordinary chemical-mechanical polishing was used to flatten the surface. Then, thermal oxidation was used to form a $Cu_xO$ film (120 nm thick), after which TiN (50 nm thick) was formed to fabricate the upper electrode 13. Then a negative resist was applied, electron beam irradiation was used in patterning, and ion milling was performed to form a bistable resistance element with a circular column shape of diameter 200 nm. Next, a CVD method was used to form an $SiO_2$ film, after which the resist on the bistable resistance element was removed by lifting off.

Using bistable resistance elements obtained in this way, the circuit shown in FIG. 6 was formed, similarly to Practical Example 2, as a sample for Practical Example 3.

Test Example

Driving conditions and consequent operating results for each of the samples of the above Practical Examples 1 through 3 are summarized in Table 3. Input pulse widths were 20 ns for Practical Examples 1 and 2, and 70 ns for Practical Example 3. Satisfactory results were obtained in all practical examples, and operation as RS flip-flop circuits was confirmed.

TABLE 3

| | Vp (V) | Vap (V) | Vm (V) | Ron (Ω) | Roff (Ω) | Rs (Ω) | Vt (V) | Von (V) | Voff (V) |
|---|---|---|---|---|---|---|---|---|---|
| Practical Example 1 | 0.7 | 0.4 | 0.9 | 2.1 | 4.5 | 2.0 | 0.9 | 0.44 | 0.35 |
| Practical Example 2 | 0.7 | 0.4 | 0.9 | 2.1 | 4.5 | — | 0.9 | 0.54 | 0.36 |
| Practical Example 3 | 2.3 | 1.2 | 2.5 | 5.0E+04 | 6.7E+06 | — | 1.4 | 1.19 | 0.21 |

INDUSTRIAL APPLICABILITY

A two-terminal bistable switching element having (non-volatile) memory properties (spin-valve element, atomic switch, or similar) is used, so that a logic circuit with a simple configuration and good current efficiency can be provided.

The invention claimed is:

1. A logic circuit, comprising:
   a two-terminal bistable switching element that has characteristics such that a state having a first resistance value is entered when a voltage equal to or less than a first threshold voltage is applied, and a state having a second resistance value different from the first resistance value is entered when a voltage equal to or greater than a second threshold voltage which is greater than the first threshold voltage, is applied, and that has characteristics which maintain each of the states when no voltage is applied;
   a first switching element, one end of which is connected to one of the terminals of the two-terminal bistable switching element;
   a second switching element, one end of which is connected, via a resistor element, to the other terminal of the two-terminal bistable switching element; and first and second pulse input terminals, respectively connected to the one terminal and the other terminal of the two-terminal bistable switching element;

wherein when a bias voltage is applied across the other end of the first switching element and the other end of the second switching element, and a trigger pulse is input from the first and second pulse input terminals.

2. The logic circuit according to claim 1, further comprising third and fourth switching elements, respectively connected to the one terminal and the other terminal of the two-terminal bistable switching element, and characterized in that, when a trigger pulse is input from the second pulse input terminal, the third switching element operates so as to lower the impedance at the one terminal of the two-terminal bistable switching element, and when a trigger pulse is input from the first pulse input terminal, the fourth switching element operates so as to lower the impedance at the other terminal of the two-terminal bistable switching element.

3. The logic circuit according to claim 1, wherein the two-terminal bistable switching element is a spin-valve element having at least an insulating layer or a nonmagnetic layer, and a pair of ferromagnetic layers having different coercivities and provided so as to sandwich the insulating layer or nonmagnetic layer.

4. The logic circuit according to claim 1, wherein the two-terminal bistable switching element is a bistable resistance element having an insulating thin film and a pair of electrodes provided so as to sandwich the insulating thin film.

5. The logic circuit according to claim 1, wherein the two-terminal bistable switching element is an atomic switch that is configured to control, by applying an electric field to a minute gap between a solid electrolytic electrode and a metal electrode, the formation and annihilation of metal clusters in the gap, and to perform electrical on/off switching across the solid electrolyte electrode and the metal electrode by means of this control.

6. The logic circuit according to claim 1, wherein the first and second pulse input terminals are each connected via a rectifying element.

7. A logic circuit, comprising:

first and second two-terminal bistable switching elements, that have characteristics such that a state having a first resistance value is entered when a voltage equal to or less than a first threshold voltage is applied, and a state having a second resistance value different from the first resistance value is entered when a voltage equal to or greater than a second threshold voltage which is greater than the first threshold voltage is applied, that have characteristics which maintain each of the states when no voltage is applied, and that are connected in series with polarities matching;

first and second switching elements, one end of which is connected to one end and to the other end respectively of the series circuit of the first and second two-terminal bistable switching elements;

a first pulse input terminal, connected to one end and to the other end of the series circuit; and a second pulse input terminal, connected to the center point of the series circuit;

wherein when a bias voltage is applied across the other end of the first switching element and the other end of the second switching element, and a trigger pulse is input from the first and second pulse input terminals.

8. The logic circuit according to claim 7, further comprising third, fourth, and fifth switching elements, respectively connected to the one end, the other end, and the center point of the series circuit, and characterized in that, when a trigger pulse is input from the second pulse input terminal, the third and fourth switching elements operate so as to lower the impedance at the one end and at the other end of the series circuit, and when a trigger pulse is input from the first pulse input terminal, the fifth switching element operates so as to lower the impedance at the center point of the series circuit.

9. The logic circuit according to claim 7, wherein at least one of the first and second two-terminal bistable switching elements is a spin-valve element having at least an insulating layer or a nonmagnetic layer, and a pair of ferromagnetic layers having different coercivities and provided so as to sandwich the insulating layer or nonmagnetic layer.

10. The logic circuit according to claim 7, wherein at least one of the first and second two-terminal bistable switching elements is a bistable resistance element having an insulating thin film and a pair of electrodes provided so as to sandwich the insulating thin film.

11. The logic circuit according to claim 7, wherein at least one of the first and second two-terminal bistable switching elements is an atomic switch that is configured to control, by applying an electric field to a minute gap between a solid electrolytic electrode and a metal electrode, the formation and annihilation of metal clusters in the gap, and to perform electrical on/off switching across the solid electrolyte electrode and the metal electrode by means of this control.

12. The logic circuit according to claim 7, wherein the first and second pulse input terminals are each connected via a rectifying element.

\* \* \* \* \*